(12) United States Patent
Giray et al.

(10) Patent No.: US 10,826,006 B2
(45) Date of Patent: Nov. 3, 2020

(54) PHOTOVOLTAIC YARN AND A PRODUCTION METHOD

(71) Applicant: KORDSA TEKNIK TEKSTIL ANONIM SIRKETI, Kocaeli (TR)

(72) Inventors: Hasan Berk Giray, Kocaeli (TR); Serap Gunes, Istanbul (TR); Fatih Ongul, Istanbul (TR); Sureyya Aydin Yuksel, Istanbul (TR)

(73) Assignee: KORDSA TEKNIK TEKSTIL ANONIM SIRKETI, Kocaeli (TR)

( * ) Notice: Subject to any disclaimer, the term of this patent is extended or adjusted under 35 U.S.C. 154(b) by 188 days.

(21) Appl. No.: 15/548,772

(22) PCT Filed: Feb. 4, 2016

(86) PCT No.: PCT/TR2016/050024
§ 371 (c)(1),
(2) Date: Aug. 4, 2017

(87) PCT Pub. No.: WO2016/126223
PCT Pub. Date: Aug. 11, 2016

(65) Prior Publication Data
US 2018/0026217 A1 Jan. 25, 2018

(30) Foreign Application Priority Data
Feb. 4, 2015 (TR) .................. 2015/01257

(51) Int. Cl.
*H01L 51/44* (2006.01)
*H01L 51/42* (2006.01)
(Continued)

(52) U.S. Cl.
CPC ............... *H01L 51/44* (2013.01); *D02G 3/36* (2013.01); *D02G 3/441* (2013.01);
(Continued)

(58) Field of Classification Search
CPC ... H01L 51/44; H01L 51/441; H01L 51/0003; H01L 51/0021; H01L 51/0036;
(Continued)

(56) References Cited

U.S. PATENT DOCUMENTS

| | | | |
|---|---|---|---|
| 2002/0189666 A1* | 12/2002 | Forrest | .................. H01L 51/424 136/263 |
| 2007/0079867 A1 | 4/2007 | Chittibabu et al. | |

(Continued)

FOREIGN PATENT DOCUMENTS

| | | | | |
|---|---|---|---|---|
| JP | 2002151708 A | 5/2002 | | |
| WO | WO-2007130025 A1 * | 11/2007 | .......... | H01L 27/301 |
| WO | WO2014072307 A1 | 5/2014 | | |

*Primary Examiner* — Uyen M Tran
(74) *Attorney, Agent, or Firm* — Bayramoglu Law Offices LLC

(57) ABSTRACT

The present invention relates to a photovoltaic yarn and production method wherein electrical conduction is enabled by the photovoltaic yarn comprising a texturized yarn (2) with a cathode layer (4), an active layer (6) and an anode layer (8) coating thereon, the photovoltaic yarn can generate electricity utilizing the solar light, and which is developed especially to be used in textile industry.

20 Claims, 3 Drawing Sheets

(51) Int. Cl.
*D02G 3/36* (2006.01)
*D02G 3/44* (2006.01)
*H01L 51/00* (2006.01)

(52) U.S. Cl.
CPC ...... *H01L 51/0003* (2013.01); *H01L 51/0021* (2013.01); *H01L 51/0035* (2013.01); *H01L 51/0036* (2013.01); *H01L 51/0037* (2013.01); *H01L 51/0047* (2013.01); *H01L 51/4253* (2013.01); *H01L 51/441* (2013.01); *Y02E 10/549* (2013.01); *Y02P 70/50* (2015.11)

(58) Field of Classification Search
CPC ............. H01L 51/0047; H01L 51/0037; H01L 51/0035; H01L 51/4253; D02G 3/36; D02G 3/44; Y02P 70/521; Y02E 10/549
See application file for complete search history.

(56) References Cited

U.S. PATENT DOCUMENTS

| | | | |
|---|---|---|---|
| 2007/0137701 A1 | 6/2007 | Sainte Catherine et al. | |
| 2007/0148797 A1* | 6/2007 | Newsome | B82Y 10/00 438/21 |
| 2011/0023955 A1* | 2/2011 | Fonash | B82Y 20/00 136/256 |
| 2013/0328026 A1* | 12/2013 | Bhansali | H01B 1/128 257/40 |
| 2014/0000700 A1* | 1/2014 | Kim | H01L 51/441 136/256 |
| 2014/0256955 A1* | 9/2014 | Bender | H01L 51/00 548/403 |

* cited by examiner

PHOTOVOLTAIC YARN AND A PRODUCTION METHOD

CROSS REFERENCE TO RELATED APPLICATIONS

This application is the national phase entry of International Application No. PCT/TR2016/050024, filed on Feb. 4, 2016, which is based upon and claims priority to Turkey Patent Application No. TR2015/01257, filed on Feb. 4, 2015, the entire contents of which are incorporated herein by reference.

FIELD OF THE INVENTION

The present invention relates to a photovoltaic yarn and production method which can generate electricity utilizing daylight and which is developed especially to be used in textile industry.

BACKGROUND

Energy sources used in earth are consumed swiftly; on the other hand need for these sources increases gradually. Interest for clean energy sources has increased due to the energy consumption technologies using fossil fuels creating heating and other environmental threats in recent years. For this reason, sun which is especially a long life natural source is used as an alternative energy source. Solar cells or photovoltaic structures are semi-conductive devices comprised of semi-conductive materials converting solar light coming their surfaces directly into the electric energy, which have long life, durable and which do not cause environmental pollution.

Solar cells can be divided into three following categories:
1) First Generation: Crystal silicon solar cells (c-Si and mc-Si)
2) Second Generation: Thin film solar cells (a-Si, CdTe, CIS or CIGS)
3) Third Generation: Nano technology based organic solar cells Today, although first generation solar cells do not have large amounts of money commercially and common production field, production costs of photovoltaic cells and the energy consumed during production is quite much. For this reason, the research is focused on decreasing the materials that are used, and reducing the costs of solar cells with simple and easy production technologies. Today, the scientific studies performed on this subject are divided into two, namely organic and inorganic based. The efficiency is high in inorganic photovoltaic cells relative to organic cells; however coating organic photovoltaics prepared with organic materials on the flexible base plates, applying on wide areas, being lightweight and cheap, being produced easily and easily changing their chemical properties and being produced by using continuous pressing techniques make them appealing in photovoltaic cell market.

Organic solar cell research focuses on two kinds of materials. These are materials subjected to wet process and vacuum process. Since materials subjected to wet process should dissolve generally in organic solvents, side chain functionality is provided for the organic materials and they are enabled to dissolve in general organic solvents. Spin coating, doctor blading, screen printing, ink jet printing, roll to roll process can be applied to the materials subjected to wet process.

Generally conjugated polymers are used as electron donor materials, and fullerenes or small organic molecules are used as electron acceptor materials in organic photovoltaic cells. In volume hetero joint photovoltaic cells, donor-acceptor materials are mixed in order to form a web penetrate one within the other in nanometric scale. With this method, donor-acceptor intermediate surface is coated on the whole volume and the contact surface is increased. With the simplest definition, organic solar cells are made by placing an active layer between two electrodes. The organic polymer layer absorbs the solar light and forms electron and hole pairs (excitons). Strong electrical field is generated with sudden change in the potential energy in the intermediate surface. The exciton pairs are separated from each other with the generated electrical field. After the charges are separated, the electrons move toward the cathode, and the holes move toward the anode. Current and voltage is generated in this way.

Photovoltaic textiles are structures which can generate electricity utilizing solar light. With the photovoltaic structure formed on the textile products by using solar cells or textile material (fabric, yarn, etc.) integrated thereon without losing its ow properties, photovoltaic textile or photovoltaic fibers having the potential to be used in many areas can be produced.

Today, various metal wires, polymer coated textile products (fabric, yarn etc) are used as base plate in photovoltaic fiber, belt or textiles produced by using organic materials. Metal, metal oxide or conductive polymers having electrical conduction are coated on the base plate. Organic based photoactive materials, electron donor conjugated polymers, electron acceptor fullerenes or small organic molecules are coated on this layer with various methods. Photovoltaic structure is formed by coating various metals such as aluminum (Al), silver (Ag) and gold (Au) as upper electrode on the photoactive layer. In the photovoltaic structure, the metals used as upper electrode in order to enable the incoming light to reach the photoactive layer are coated in thickness of approximately 10 nm. In the photovoltaic structure, the metal upper electrode coated very thin is used both as semi optic permeable and electrically conductive layer.

However in these methods used today, vacuum medium is required in coating metals used as electrode in the photovoltaic structure. Coating metal requires expensive vacuum systems. These systems limit the lengths of the material to be coated and it has the disadvantage to perform coating on single surface.

Furthermore, when these metals are coated as upper electrode on the side where the light is coming from in the photovoltaic structure, it negatively affects the electrical conduction since it is coated in a thin form in order to provide light permeability. Besides, the metals coated in vacuum structure limits the flexibility of the photovoltaic structure.

SUMMARY

The objective of the present invention is to provide a photovoltaic yarn production method wherein gallium-indium alloy is used in the photovoltaic structure.

A further objective of the present invention is to provide a photovoltaic yarn production method wherein coated is performed without requiring vacuum system.

Yet another objective of the present invention is to provide a photovoltaic yarn production method wherein coating is performed in atmosphere or inert gas medium.

A further objective of the present invention is to provide a photovoltaic yarn which is comprised of a plurality of layers as well as anode and cathode.

BRIEF DESCRIPTION OF THE DRAWINGS

"A photovoltaic yarn and production method" developed to fulfill the objective of the present invention is illustrated in the accompanying figures wherein.

Figure 1:
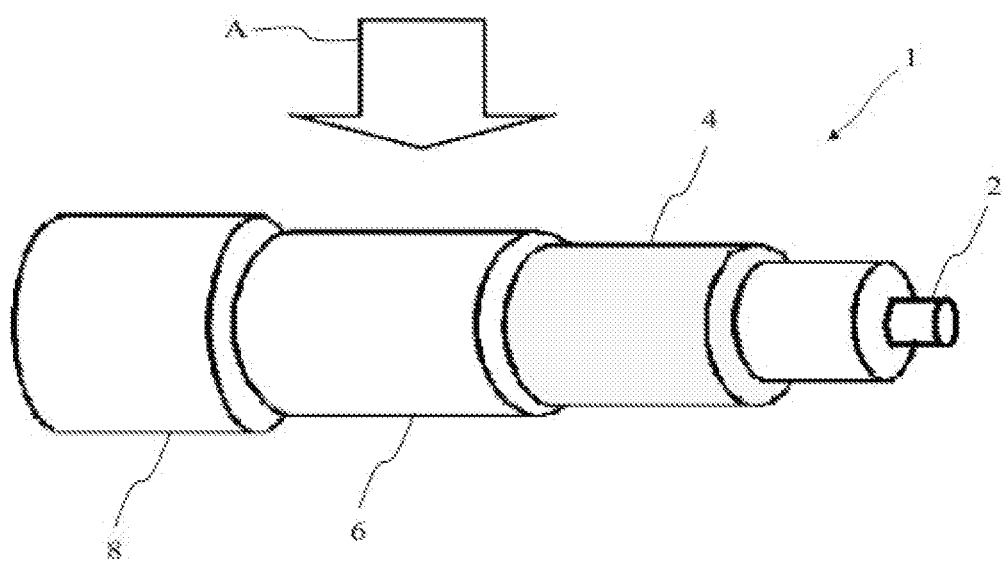
FIG. 1 is the perspective view of one embodiment of the inventive photovoltaic yarn wherein the layers can be observed.
Figure 2:
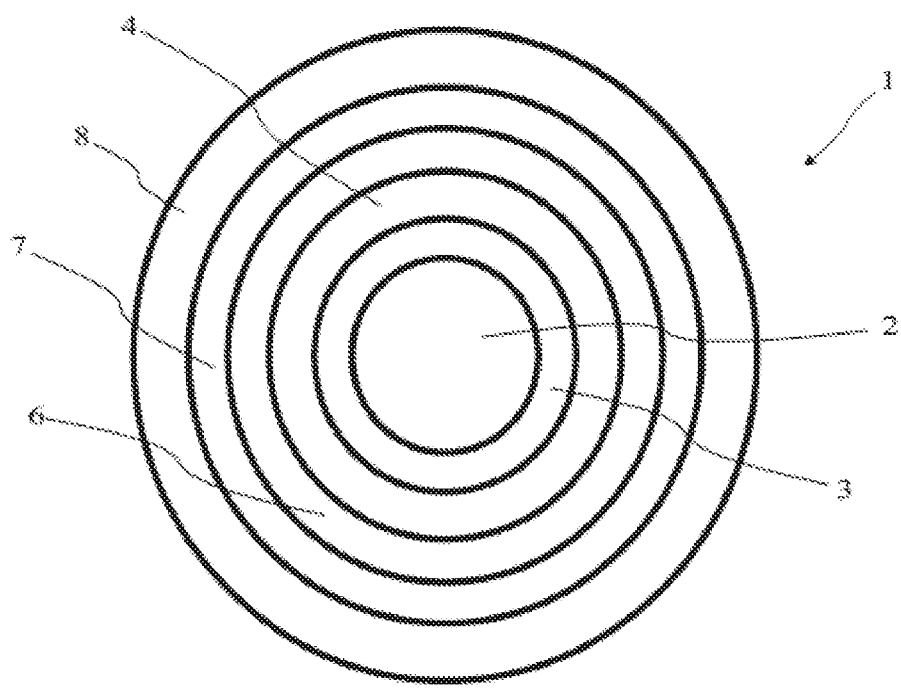
FIG. 2 is the cross sectional view of another embodiment of the inventive photovoltaic yarn wherein the layers can be observed.
Figure 3:
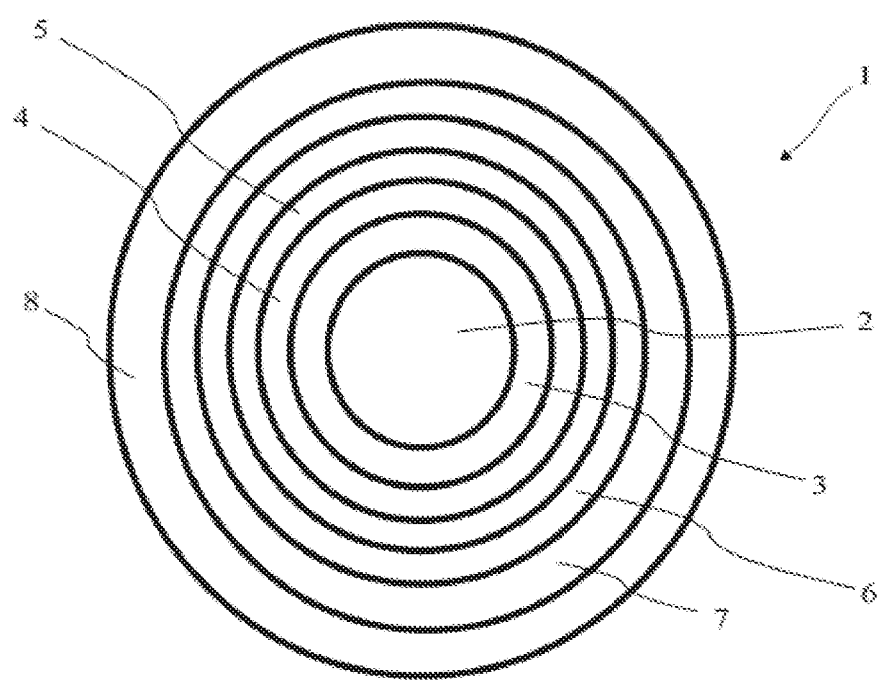
FIG. 3 is the cross sectional view of a further embodiment of the inventive photovoltaic yarn wherein the layers can be observed.
Figure 4:
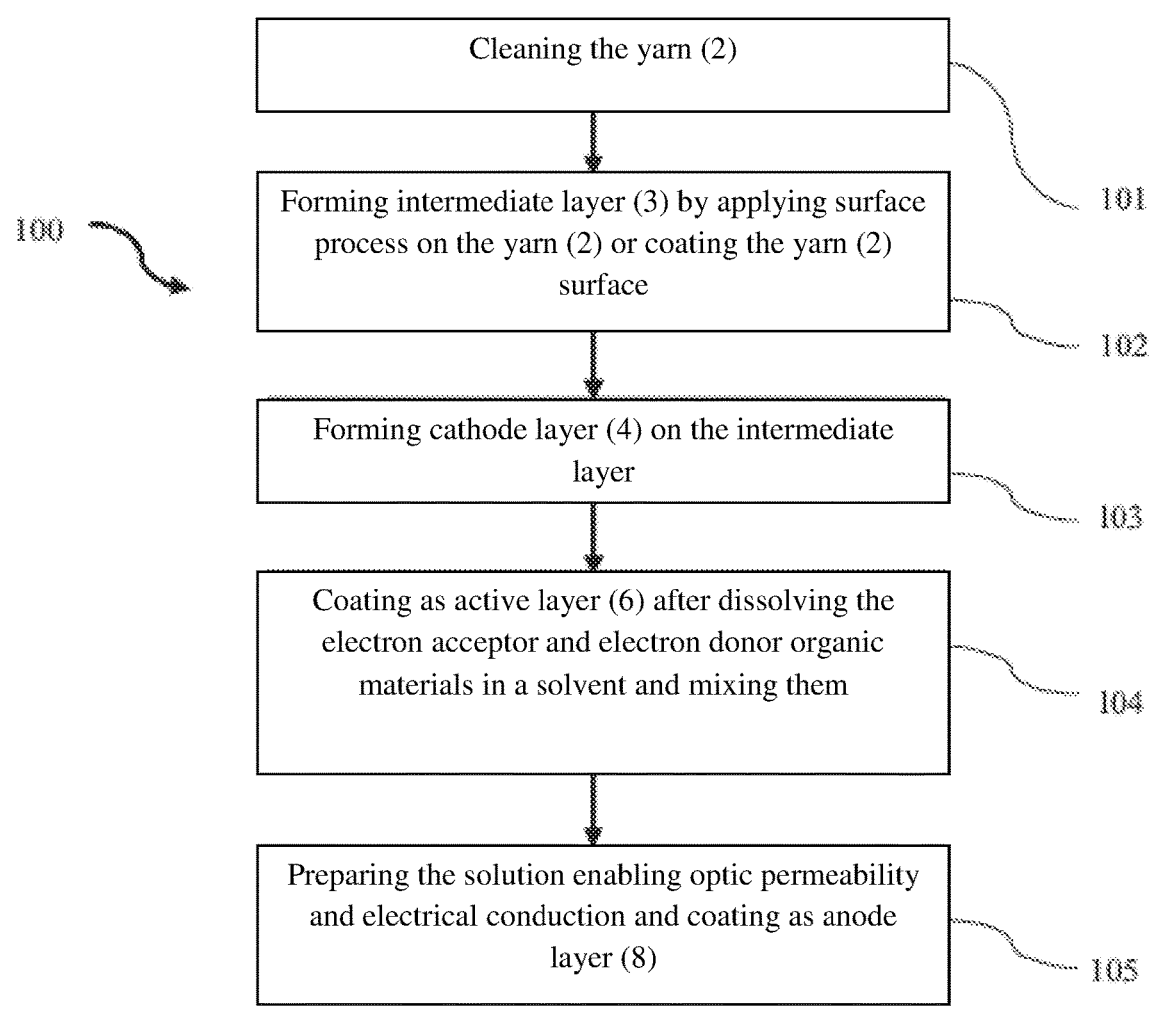
FIG. 4 is the flow chart of the inventive photovoltaic yarn production method.

The elements in the figures belonging to the photovoltaic yarn have ben numerated as follows:
1. Photovoltaic yarn
2. Yarn
3. Intermediate layer
4. Cathode layer
5. Electron transmission layer (Hole prevention layer) (ETL)
6. Active layer
7. Hole transmission layer (Electron prevention layer) (HTL)
8. Optic permeable and conductive layer (Anode layer)
A. Light

DETAILED DESCRIPTION OF THE EMBODIMENTS

The inventive photovoltaic yarn (1) essentially comprises
at least one a texturized yarn (2),
at least one an intermediate layer covering the yarn (2) and increase the adhesion strength of the yarn (2),
at least one a cathode layer (4) which is coated by attaching on the yarn (2) by means of the intermediate layer (3) and which has a photovoltaic structure,
at least one an active layer (6) which is located on the cathode layer (4), comprises electron acceptor and electron donor materials, and which has a photovoltaic structure,
at least one an anode layer (8) which enables the light (A) coming from any light source to be transferred to other layers by means of its optic permeable structure, and perform electrical conduction by interacting with the cathode layer (4).

In one embodiment of the invention, there is at least one the electron transmission layer (5) between the cathode layer (4) and the active layer (6). In this embodiment of the invention, the electron transmission layer (5) prevents the recombination of charge carriers on the intermediate surface of the cathode layer (4) and the active layer (6), and allows only the electrons to pass among the charge carriers. Furthermore, this layer (5) increases the charge collecting efficiency by forming an intermediate energy step in order to eliminate energy barrier between the electrode and the organic semi-conductive. This layer (5) also increases the stability of the photovoltaic structure depending on the features of the materials used therein.

In one embodiment of the invention, there is a hole transmission layer (HTL) (electron prevention layer) between the active layer (6) and the anode layer (8).

The hole transmission layer (7) allows only the holes to pass to the anode layer (8) from the active layer (6), and prevents the recombination with the electrons. Furthermore, this layer (7) increases the charge collecting efficiency by forming an intermediate energy step in order to eliminate energy barrier between the electrode and the organic semi-conductive. Depending on the features of the material used inside the HTL (7), it also strengthens the attachment of the anode layer (8) on the active layer (6) as well as increasing the stability of the photovoltaic structure.

The inventive photovoltaic yarn (1) is essentially comprised of an active layer (6) placed between a cathode layer (4) and an anode layer (8) (cathode/active layer/anode). In order to increase stability and efficiency, it can be formed only by placing the electron transmission layer (5) between the cathode layer (4) and the active layer (6) (cathode/ETL/active layer/anode), as well as it can be formed by placing only the hole transmission layer (7) between the active layer (6) and the anode layer (8) (cathode/active layer/HTL/anode). The inventive photovoltaic yarn (1) can also be formed by using both the electron transmission layer (5) and the hole transmission layer (7) (cathode/ET/active layer/HTL/anode).

The production method (100) of the inventive photovoltaic yarn (1) is performed in atmospheric or inert gas medium, and comprises the steps of
cleaning the yarn (2) (101),
forming the intermediate layer (3) by applying surface process on the yarn (2) or coating the yarn (2) surface (103),
forming the cathode layer (4) on the intermediate layer (103),
coating as the active layer (6) after dissolving the electron acceptor and electron donor organic materials in a solvent and mixing them (104),
preparing the solution enabling optic permeability and electrical conduction and coating as the anode layer (8) (105).

The yarn (2) forming the inner structure of the inventive photovoltaic yarn (1) is cleaned by passing through methanol, isopropanol, and distilled water processes respectively before it is coated (101). In one embodiment of the invention, surface process is applied in order to enhance attachment force between the yarn (2) and the cathode layer (4) with mechanical or chemical wearing and ultraviolet ozonisation before the yarn (2) is coated (102). In another embodiment, polymer based solutions such as polymethylmetacrylate (PMMA), polyethylene terephthalate (PET) or polyvinyl alcohol (PVA) are coated on the cleaned yarn (2) and heat treatment is applied, therefore the intermediate layer (3) is formed on the yarn (2) (102). The intermediate layer (3) or surface process applications are used for increasing the holding force between the yarn (2) and the cathode layer (4).

The cathode layer (4) formed on the intermediate layer (3) is gallium-indium (Ga—In) alloy in photovoltaic structure, and it is coated in room conditions (103). Ga—In alloy can function as cathode as it is compatible with LUMO (lowest unoccupied molecular orbital) energy level of all electron acceptor materials. Furthermore, since it is in liquid form in room conditions, it can be coated on desired surfaces without requiring any vacuum system. In one embodiment of the invention, the cathode layer (4) is coated on the intermediate layer (3) by spreading with a brush (103). The cathode layer (4) enables the transmission of electrons generated in the active layer.

In one embodiment of the invention, the electron transmission layer (5) is coated on the cathode layer (4). For this purpose, after solution based materials such as titanium dioxide ($TiO_2$), zinc oxide (ZnO) or cesium carbonate ($Cs_2CO_3$) are coated as electron transmission layer (5) in atmosphere medium with dripping, dipping or spraying, heat treatment is performed in order to remove the solvent.

The active layer (6) coated on the cathode layer (4) in one embodiment of the invention, and on the electron transmission layer (5) in another embodiment is a volume hetero joint layer which comprises both electron acceptor and electron donor organic materials in its structure. The layer (6) absorbs the light coming from the sun, and it is the layer wherein the electron and hole pairs (excitons) are formed and the free charged are generated by separating on the intermediate surface. In order to obtain the material forming the active layer (6), p-type poli(3-hexylthiophene) (P3HT), poly[N-9'-hepta-decanyl-2,7-carb azole-alt-5,5-(4',7'-di-2-thienyl-2',1',3'-benzothiadiazole)] (PCDTBT), Poly[2,6-(4,4-bis-(2-ethylhexyl)-4H-cyclopenta [2,1-b;3,4-b']dithiophene)-alt-4,7(2,1,3-benzothiadiazole)] (PCPDTBT), Poly ({4,8-bis[(2-ethylhexyl)oxy] benzo[1,2-b:4,5-b'] dithiophene-2,6-diyl}{3-fluoro-2-[(2-ethylhexyl) carbonyl] thieno[3,4-b]thiophenediyl}) (PTB7) and such semi conductive polymers as electron donors; n-type carbon-60 derived [6,6]-phenyl-$C_{61}$-butyric acid methyl ester (PCBM); (6,6)-phenyl $C_{71}$-butyric acid methyl ester ($PC_{71}BM$), 1',1'',4',4''-Tetrahydro-di[1,4]methanonaphthaleno[1,2:2',3',56,60:2'', 3''][5,6]fullerene-C60, C60 derivative, indene-C60 bisadduct (ICBA) and such semi conductive polymers as electron acceptors are dissolved in organic solvents such as chlorobenzene, dichlorobenzene and chloroform in certain amounts and a homogenous mixture is prepared. The said mixture which is prepared is coated as the active layer (6) in atmosphere or inert gas medium with methods such as dripping, dipping and spraying, and then heat treatment is applied in order to remove the solvent (104).

In one embodiment of the invention, the optic permeable hole transmission layer (7) is coated on the active layer (6). With this purpose, the solution prepared by dissolving vanadium pentoxide ($V_2O_5$), molybdenum oxide ($MoO_3$), tungsten trioxide ($WO_3$) or nickel oxide (NiO) in suitable solutions is coated in atmosphere medium with dripping, dipping or spraying, and then heat treatment is applied in order to remove the solvent. The hole transmission layer (7) increases the attachment of the anode layer (8) on the surface as well as it has a photovoltaic structure.

Poly(3,4-ethylenedioxythyophene): polysturenesulphonate (PEDOT:PSS) and derivatives with high conductivity and optic permeability and large work function are used as the anode layer (8) Dimethyl sulfoxide (DMSO) is added in order to increase the conductivity of PEDOT:PSS, and triton X-100 is added in order to decrease the surface tension and increase the wettability. In the preferred embodiment of the invention, PEDOT:PSS mixture comprises 5% DMSO, 0.1% Triton X-100 by mass. This mixture which is prepared is coated in atmosphere medium with methods such as dripping, dipping and spraying, and then heat treatment is applied in order to remove the solvent (105). In another embodiment of the invention, indium tin oxide (ITO), graphene or carbon nanotube can also be used as the anode layer (8).

The anode layer (8) is coated on the active layer (6) in one embodiment of the invention, and it is coated on the hole transmission layer (7) in another embodiment of the invention (105). The anode layer (8) enables the transmission of holes generated in the active layer (6).

If the organic materials are not protected against oxygen and humidity, they corrode in very short time. However, most of technological applications require operation in environmental conditions. For this reason, encapsulation process is performed after production in order to elongate the life of polymer solar cells.

Converting light into electric current in organic solar cells is essentially realized in five steps.

1. Realizing a stimulated state after the light coming from the sun, in other words, photon, is absorbed and the electron-hole pair (exciton) being formed
2. The exciton passing (diffusion) to the donor-acceptor intermediate surface where the charge separation will be realized. The exciton charge separation being realized on the donor-acceptor intermediate surface
4. The diffusion of the separated free charge carriers, in other words the holes, to the anode and the electrons to the cathode
5. Finally collecting the charges in suitable electrodes, in other words the holes in the anode and the electrons in the cathode in order to obtain direct current In case the energy of the photon coming from the sun is bigger than the forbidden band width energy of the organic semiconductor, the photon is absorbed by the semiconductor material and the electron leaves a hole behind and goes LUMO (the lowest unoccupied molecular orbital) level from HOMO (the highest occupied molecular orbital) level, and it is formed inside the electron-hole pair active layer (6) connected to each other and named as exciton. Excitons move towards the donor-acceptor intermediate surface; and if the excitons cannot reach the intermediate surface during their life time, the electron and the hole recombine and this energy emerges in form of heat or light. For this reason, the thickness of the two layer structure is limited with the length of the exciton diffusion. Exciton diffusion length is about 5-10 nm in polymers and organic semiconductors. These electron and hole which are formed are connected to each other with Coulomb interaction, and the exciton connection energy in organic semiconductors is higher relative to inorganic semiconductors. For this reason, photo stimulations in room temperature do not form free charge carrier in organic semiconductors. Excitons require strong electric fields so that they can become free charge carrier. These strong electric fields are possible with sudden potential energy changes in an intermediate surface (E=-gradU). Among the free charge carriers that are formed, holes move toward the anode layer (8), and the electrons move toward the cathode layer (4). In case there is an electron transmission layer (5), it allows only the electrons passing to the related electrode, and similarly in case there is a hole transmission layer (7) it allows only the holes passing to the related electrode, and prevents reverse charge transfers. In order to obtain a useful power output in solar cells, the free charge carrier is required to be transferred to the suitable electrodes. Among the free charge carriers that are formed, the electrons are collected in the low work function the cathode layer (4), and the holes are collected in the high work function the anode layer (8). In order that the photons coming from the sun reach the active layer (6), the layers on the side where the light comes from should have high optic permeability. In the inventive photovoltaic yarn, the hole transmission layer (7) and/or the anode layer (8) should have high optic permeability and conduction.

What is claimed is:

1. A photovoltaic yarn, comprising:
   at least one texturized yarn,
   at least one intermediate layer covering the at least one texturized yarn to increase an adhesion strength of the at least one texturized yarn,
   at least one cathode layer comprising a gallium-indium alloy coating on the at least one texturized yarn by means of the at least one intermediate layer,
   at least one active layer comprising an electron donor material selected from the group consisting of poly [N-9'-hepta-decanyl-2,7-carbazole-alt-5,5-(4',7'-di-2-thienyl-2',1',3'-benzothiadiazole)](PCDTBT), poly [2,6-(4,4-bis-(2-ethylhexyl)-4H-cyclopenta [2,1-b;3,4-b']dithiophene)-alt-4,7(2,1,3-benzothiadiazole)] (PCP-DTBT), poly ({4,8-bis[(2-ethylhexyl) oxy]benzo[1,2-b:4,5-b'] dithiophene-2,6-diyl}{3-fluoro-2-[(2-ethylhexyl) carbonyl] thieno[3,4-b]thiophenediyl}) (PTB7) and semi conductive polymers, and an electron acceptor material selected from the group consisting of 1',1'',4',4''-Tetrahydro-di[1,4]methanonaphthaleno[1,2: 2',3',56,60:2'',3'' ][5,6] fullerene-C60, C60 derivative, indene-C60 bisadduct (ICBA) and semi conductive polymers,
   at least one anode layer, wherein the at least one anode layer is a mixture of polymers comprising poly (3,4-ethylenedioxythyophene) (PEDOT), polystyrenesulphonate (PSS), dimethyl sulfoxide (DMSO) and triton X-100,
   wherein the at least one texturized yarn is located at a center and the at least one intermediate layer and the at least one cathode layer and the at least one active layer and the at least one anode layer are concentrically formed radially outward, respectively, from the at least one texturized yarn so that the photovoltaic yarn defines a filament structure.

2. The photovoltaic yarn according to claim 1, wherein the at least one anode layer comprises poly(3,4-ethylenedioxythyophene)(PEDOT) and polystyrenesulphonate (PSS), wherein the at least one anode layer further comprises a 5% DMSO and 0.1% Triton X-100, by mass percentage.

3. The photovoltaic yarn according to claim 1, wherein an electron transmission layer is located between the at least one cathode layer and the at least one active layer.

4. The photovoltaic yarn according to claim 1, wherein a hole transmission layer (electron prevention layer) in photovoltaic structure is located between the at least one active layer and the at least one anode layer.

5. A method of producing the photovoltaic yarn of claim 1, wherein the method comprises following sequential steps:
   forming the at least one intermediate layer by surface treatment of the at least one texturized yarn or coating at least one texturized yarn surface,
   forming the at least one cathode layer on the at least one intermediate layer by coating the at least one intermediate layer with the gallium-indium alloy at atmospheric conditions,
   coating the at least one cathode layer with the at least one active layer after dissolving and mixing the electron acceptor and electron donor organic materials in a solvent,
   coating the at least one anode layer on the at least one cathode layer.

6. The method according to claim 5, wherein the step of forming the at least one cathode layer on the at least one intermediate layer with gallium-indium alloy (Ga—In) in liquid form is conducted at the atmospheric conditions via a brush without needing any vacuum system.

7. The method according to claim 5, wherein the step of forming electron transmission layer is conducted by applying ZnO and/or TiO2 solution on the at least one cathode layer with dripping, dipping or spraying, and applying heat treatment.

8. The method according to claim 5, wherein in the step of coating the electron acceptor and t electron donor organic materials as the at least one active layer after dissolved and mixed in the solvent, the at least one active layer is coated on the at least one cathode layer.

9. The method according to claim 7, wherein in the step of coating the electron acceptor and t electron donor organic materials as the at least one active layer after dissolved and mixed in the solvent, the at least one active layer is coated on the electron transmission layer.

10. The method according to claim 5, wherein in the step of forming hole transmission layer is conducted by coating solution prepared by dissolving vanadium pentoxide (V2O5), molybdenum oxide (M0O3), tungsten trioxide (WO3) or nickel oxide (NiO) in a solvent on the at least one active layer via dripping, sipping, or spraying and applying heat treatment.

11. The method according to claim 5, wherein in the step of preparing solution enabling optic permeability and electrical transmission and coating as the at least one anode layer, the at least one anode layer is coated on the at least one active layer.

12. The method according to claim 10, wherein in the step of preparing solution enabling optic permeability and electrical transmission and coating as the at least one anode layer, the at least one anode layer is coated on the hole transmission layer.

13. The photovoltaic yarn according to claim 2, wherein a hole transmission layer (electron prevention layer) in photovoltaic structure is located between the at least one active layer and the at least one anode layer.

14. The photovoltaic yarn according to claim 3, wherein a hole transmission layer (electron prevention layer) in photovoltaic structure is located between the at least one active layer and the at least one anode layer.

15. The method according to claim 6, wherein in the step of forming hole transmission layer is conducted by coating solution prepared by dissolving vanadium pentoxide (V2O5), molybdenum oxide (M0O3), tungsten trioxide (WO3) or nickel oxide (NiO) in a solvent on the at least one active layer via dripping, sipping, or spraying and applying heat treatment.

16. The method according to claim 8, wherein in the step of forming hole transmission layer is conducted by coating solution prepared by dissolving vanadium pentoxide (V2O5), molybdenum oxide (M0O3), tungsten trioxide (WO3) or nickel oxide (NiO) in a solvent on the at least one active layer via dripping, sipping, or spraying and applying heat treatment.

17. The method according to claim 9, wherein step of forming hole transmission layer is conducted by coating solution prepared by dissolving vanadium pentoxide (V2O5), molybdenum oxide (M0O3), tungsten trioxide (WO3) or nickel oxide (NiO) in a solvent on the at least one active layer via dripping, sipping, or spraying and applying heat treatment.

18. The method according to claim 8, wherein in the step of preparing solution enabling optic permeability and electrical transmission and coating as the at least one anode layer, the at least one anode layer is coated on the at least one active layer.

19. The method according to claim 9, wherein in the step of preparing solution enabling optic permeability and electrical transmission and coating as the at least one anode layer, the at least one anode layer is coated on the at least one active layer.

20. A photovoltaic yarn, consisting of:
at least one texturized yarn,
at least one intermediate layer covering the at least one texturized yarn to increase an adhesion strength of the at least one texturized yarn,
at least one cathode layer consisting of a gallium-indium alloy coating on the at least one texturized yarn by means of the at least one intermediate layer,
at least one active layer consisting of an electron donor material selected from the group consisting of poly [N-9'-hepta-decanyl-2,7-carbazole-alt-5,5-(4',7'-di-2-thienyl-2',1',3'-benzothiadiazole)](PCDTBT), poly [2,6-(4,4-bis-(2-ethylhexyl)-4H-cyclopenta [2,1-b;3,4-b']dithiophene)-alt-4,7(2,1,3-benzothiadiazole)] (PCP-DTBT), poly ({4,8-bis[(2-ethylhexyl) oxy]benzo[1,2-b:4,5-b'] dithiophene-2,6-diyl}{3-fluoro-2-[(2-ethylhexyl) carbonyl] thieno[3,4-b]thiophenediyl}) (PTB7) and semi conductive polymers, and an electron acceptor material selected from the group consisting of 1',1",4',4"-Tetrahydro-di[1,4]methanonaphthaleno[1,2: 2',3',56,60:2",3" ][5,6] fullerene-C60, C60 derivative, indene-C60 bisadduct (ICBA) and semi conductive polymers,
at least one anode layer, wherein the at least one anode layer is a mixture of polymers consisting of poly (3,4-ethylenedioxythyophene) (PEDOT), polystyrene-sulphonate (PSS), dimethyl sulfoxide (DMSO) and triton X-100,
wherein the at least one texturized yarn is located at a center and the at least one intermediate layer and the at least one cathode layer and the at least one active layer and the at least one anode layer are concentrically formed radially outward, respectively, from the at least one texturized yarn so that the photovoltaic yarn defines a filament structure.

* * * * *